United States Patent
Venkataraghavan et al.

(10) Patent No.: US 8,100,346 B2
(45) Date of Patent: *Jan. 24, 2012

(54) PIEZOELECTRIC ACTUATOR WITH MULTI-FUNCTION SPRING AND DEVICE USING SAME

(75) Inventors: Jayaraman Venkataraghavan, Dunlap, IL (US); Zhenlong Xu, Peoria, IL (US); Kenneth C. Adams, Bloomington, IL (US); Stephen Lewis, Chillicothe, IL (US)

(73) Assignee: Caterpillar Inc., Peoria, IL (US)

( * ) Notice: Subject to any disclaimer, the term of this patent is extended or adjusted under 35 U.S.C. 154(b) by 809 days.

This patent is subject to a terminal disclaimer.

(21) Appl. No.: 11/998,642

(22) Filed: Nov. 30, 2007

(65) Prior Publication Data
US 2009/0140072 A1    Jun. 4, 2009

(51) Int. Cl.
*B05B 1/08*    (2006.01)

(52) U.S. Cl. ........... 239/102.2; 239/102.1; 251/129.06; 310/328; 310/355; 267/170

(58) Field of Classification Search ........... 239/102.2, 239/102.1; 251/129.01, 129.06, 337; 310/328, 310/355; 267/170
See application file for complete search history.

(56) References Cited

U.S. PATENT DOCUMENTS

| | | | |
|---|---|---|---|
| 3,418,980 A * | 12/1968 | Benson | 123/294 |
| 5,113,108 A | 5/1992 | Yamashita et al. | |
| 5,166,908 A * | 11/1992 | Montgomery | 367/165 |
| 5,239,223 A | 8/1993 | Miyoshi | |
| 5,250,868 A | 10/1993 | Shirasu | |
| 5,272,797 A | 12/1993 | Miyoshi | |
| 5,477,102 A | 12/1995 | Miyoshi | |
| 6,172,445 B1 | 1/2001 | Heinz et al. | |
| 6,279,871 B1 | 8/2001 | Ogura et al. | |
| 6,333,587 B1 | 12/2001 | Heinz et al. | |
| 6,700,308 B2 | 3/2004 | Heinz | |
| 6,729,600 B2 | 5/2004 | Mattes et al. | |
| 6,755,353 B2 * | 6/2004 | Lorraine et al. | 239/102.2 |
| 6,929,192 B2 | 8/2005 | Schmauser | |
| 6,962,297 B2 | 11/2005 | Kienzler et al. | |
| 6,984,924 B1 * | 1/2006 | Voigt et al. | 310/348 |
| 7,145,282 B2 | 12/2006 | Oakley et al. | |
| 7,267,111 B2 * | 9/2007 | Liskow | 123/498 |
| 7,339,308 B2 * | 3/2008 | Boecking et al. | 310/348 |
| 7,564,175 B2 * | 7/2009 | Stier et al. | 310/348 |
| 7,714,483 B2 * | 5/2010 | Hess et al. | 310/346 |
| 7,765,877 B2 * | 8/2010 | Venkataraghavan et al. | 73/777 |

FOREIGN PATENT DOCUMENTS

| | | |
|---|---|---|
| DE | 63263 | 7/1892 |
| DE | 10259802 | 7/2004 |
| DE | 102004031597 | 2/2006 |
| DE | 102005045229 | 3/2007 |
| WO | 9918346 | 4/1999 |

* cited by examiner

*Primary Examiner* — Dinh Nguyen

(57) ABSTRACT

A piezoelectrically actuated device includes a body, a valve disposed within the body and an actuator for the valve, the actuator including a casing coupled with the body and a piezoelectric element disposed within the casing The actuator further includes a multi-function spring applying a preloading force to the piezoelectric element. The multi-function spring includes a first segment having a piston configured to translate a motion of the piezoelectric element during operation of the actuator, a second segment having at least one flexural element and a third segment having a first set of threads. The first set of threads is engaged with a second set of threads of the actuator and maintains the second segment in a tension state which corresponds with the preloading force.

15 Claims, 3 Drawing Sheets

PIEZOELECTRIC ACTUATOR WITH MULTI-FUNCTION SPRING AND DEVICE USING SAME

TECHNICAL FIELD

The present disclosure relates generally to piezoelectric devices, and relates more particularly to a multi-function spring for use in an actuator for piezoelectric devices.

BACKGROUND

Piezoelectric devices such as actuators have been the subject of much attention in recent years, due to the promise they hold for improved precision, robustness and reliability in various applications. In the art of fuel injectors, piezoelectric actuators are commonly coupled with a control valve to control the timing, duration or rate shape of fuel injection events. In general terms, a piezoelectric actuator will include one or more piezoelectric elements which, when subjected to an electrical potential, experience a conformational change. This phenomenon is leveraged to relatively precisely control the position of a component of interest coupled with the actuator, in the case of a fuel injector a control valve as mentioned above. Despite the heightened interest in piezoelectric actuators in recent years, they have yet to achieve widespread commercial use in fuel systems. Issues relating to manufacturing, assembly and operation of piezoelectric elements used in such actuators continue to challenge fuel system manufacturers.

One problem with piezoelectric actuators relates to setting the "preload" on the piezoelectric element used therein. As is well understood by those familiar with piezoelectric actuators, the piezoelectric element must typically be held in compression for it to respond predictably and reliably to an applied electrical potential. Many proposals for piezoelectric actuators couple the actuator with a relatively small, low-flow control valve which is moved rapidly to control pressure and/or flow of a larger volume of fuel within a fuel injector. In such instances, the need for predictability and reliability will be readily apparent. Where preload on the piezoelectric element of the actuator is too high or too low, however, the piezoelectric element may not behave as desired.

In a related vein, many earlier strategies for piezoelectric actuator design and assembly were driven largely by preloading concerns. In other words, traditional manufacturing goals such as reducing the number of parts, the complexity of components or eliminating assembly steps have heretofore been a relatively low priority for many designers. As a result, state of the art manufacturing strategies tend to be relatively complicated, and piezoelectric actuators are in many cases relatively cost-inefficient to make. One known piezoelectric actuator device having a relatively small number of parts is set forth in U.S. Pat. No. 7,145,282 B2 to Oakley et al. In designs proposed by Oakley et al., preloading of a stack of piezoelectric disks is purportedly achieved via elasticity of a housing for the actuator. This would appear to offer the advantage of not needing a separate element to apply the preload, as the preloading element is integrated into the housing. One disadvantage, however, is that precise preloading with Oakley et al. may be relatively difficult.

SUMMARY

In one aspect, an actuator includes a casing, a piezoelectric element positionable in the casing and a multi-function spring also positionable in the casing and configured to apply a preloading force to the piezoelectric element. The multi-function spring includes a first segment having a piston configured to translate a motion of the piezoelectric element during operation of the actuator, a second segment having at least one flexural element and a third segment having a first set of threads configured to engage with a second set of threads of the actuator to stretch the second segment to a state corresponding to the preloading force.

In another aspect, a piezoelectrically actuated device includes a body, a valve disposed within the body and an actuator for the valve, the actuator including a casing coupled with the body and a piezoelectric element disposed within the casing. The actuator further includes a multi-function spring applying a preloading force to the piezoelectric element. The multi-function spring includes a first segment having a piston configured to translate a motion of the piezoelectric element during operation of the actuator, a second segment having at least one flexural element and a third segment having a first set of threads. The first set of threads is engaged with a second set of threads of the actuator and maintains the second segment in a tension state which corresponds with the preloading force.

In still another aspect, a multi-function spring for a piezoelectric actuator includes a spring body having a first end, a second end, a length extending between the first end and the second end and a cavity extending between the first end and the second end which is configured to receive a piezoelectric element. The spring body further has a plurality of segments each comprising a portion of the length, including a first segment closing the cavity at the first end and including a piston configured to translate a motion of a piezoelectric element within the cavity during activation thereof. The spring body further includes a second segment which includes at least one flexural element and a third segment comprising a set of threads configured to engage with another set of threads of an associated piezoelectric actuator for stretching the second segment to preload a piezoelectric element within the cavity.

DETAILED DESCRIPTION

Figure 1:
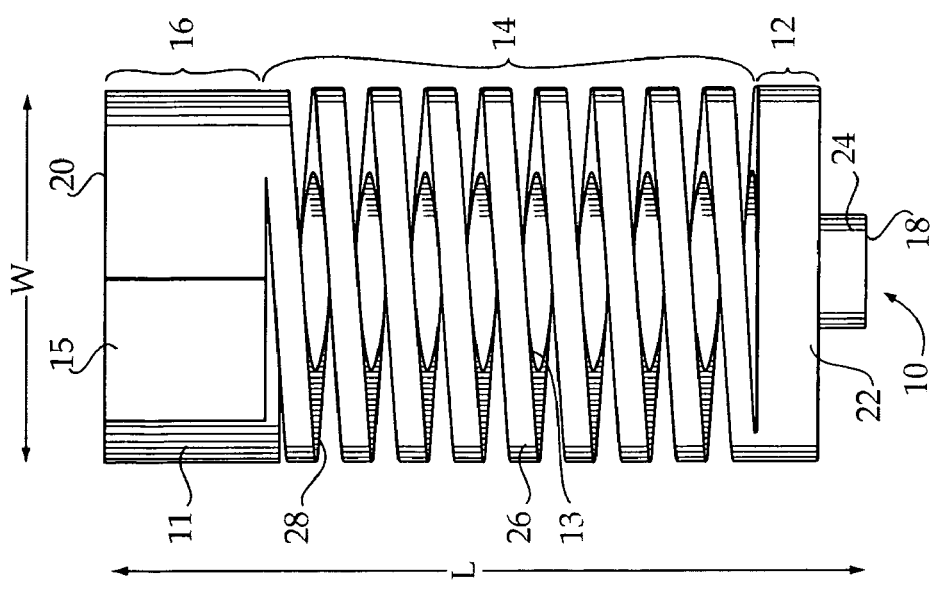
FIG. 1 is a side diagrammatic view of a multi-function spring according to one embodiment.

Referring to FIG. 1, there is shown a spring 10 according to one embodiment. Spring 10 comprises a multi-function spring which may be used in a piezoelectric actuator for, among other things, applying a preload to a piezoelectric element as further described herein. The term "multi-function" should be understood to mean that the subject spring 10 has features and operating characteristics which enable it serve more than one purpose in its intended operating environment, as will be further apparent from the following description. Spring 10, and other springs contemplated herein, may be designed in such a way that manufacturing and assembly of an actuator and a associated device employing springs according to the present disclosure will also berelatively simpler and easier than that of many earlier designs.

Figure 3:
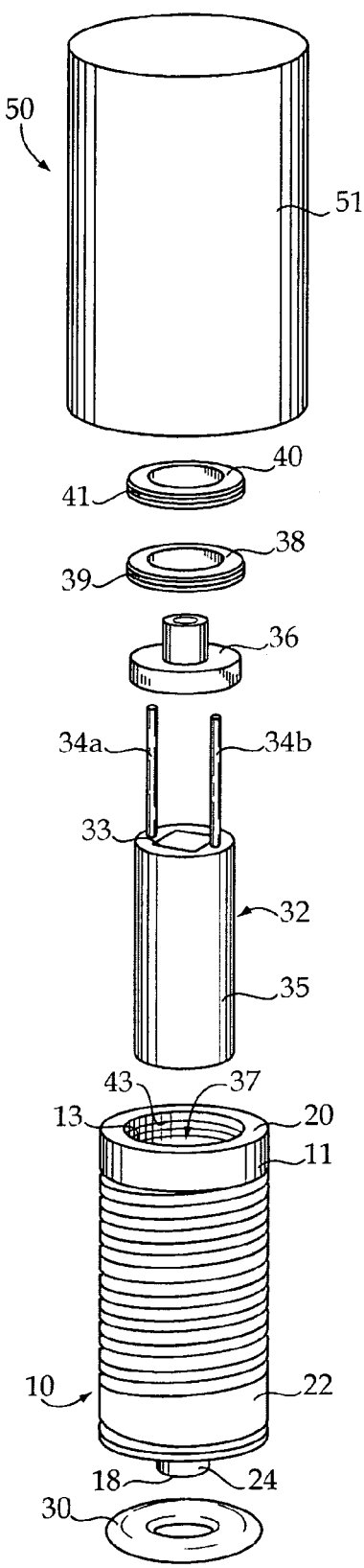
FIG. 3 is an exploded view of an actuator according to one embodiment.

Spring 10 may have a one-piece spring body 11 with a length L and a width W which may be two or more times length L but will typically be less than about five times length L. Spring 10 may further include a plurality of segments 12, 14 and 16 each comprising a portion of length L. In other words, "segments" of spring 10 or of spring body 11 as described herein may be defined as portions thereof which are separated one from the other at imaginary planes which are perpendicular length L. In one embodiment, a first segment 12 comprises an end segment which adjoins a first terminal end 18 of spring 10, a second segment 14 comprises a middle segment which adjoins segment 12 and a third segment 16 comprises another end segment which adjoins segment 14 and also adjoins a second terminal end 20 of spring 10. Third segment 16 may include one or more flats 15 to enable holding spring body 11 during manufacturing and/or assembly. In one embodiment, at least two of, and typically all of, segments 12, 14 and 16 have equal widths. First segment 12 may include a piston 22 configured to translate a motion of a piezoelectric element positioned in spring 10 during activation of the piezoelectric element, in a manner further described herein. Piston 22 may have a thickness in a direction aligned with length L which is equal to or greater than about $\frac{1}{20}^{th}$ length L in one embodiment. Referring briefly also to FIG. 3, it may be noted that a cavity 13 is formed in spring body 11. Cavity 13 may extend between first end 18 and second end 20. Piston 22 may close cavity 13 near first end 18, and a bore 37 formed in spring body 11 may extend from second end 20 to connect with and/or include cavity 13.

Returning to FIG. 1, first segment 12 may further include a contact button 24 configured to contact a valve element such as a movable valve member or other component which is to be adjusted via activation of a piezoelectric element in cavity 13. Contact button 24 may be cylindrical and relatively smaller in width than piston 22, and piston 22 may assist in guiding spring 10 within a casing, described below, during extension and contraction of spring 10 as will occur during activation of a piezoelectric element associated therewith. During extension and contraction of spring 10, coil 26 may flex much like a coil spring. Second segment 14 may have a cylindrical shape in one embodiment, and includes at least one flexural element 26. In the illustrated embodiment, the at least one flexural element comprises a resilient helical coil 26 which extends for substantially an entirety of a length of second segment 14 between first segment 12 and third segment 16. A helical slot 28 extends adjacent and generally in parallel with coil 26. A single helical slot 28 and single helical coil 26 may be used in one embodiment, but in other embodiments multiple slots and coils might be used. Spring 10 may consist of a single piece of machined metallic material, such as a machined piece of steel rod stock or the like. In other embodiments, spring 10 may be constructed from multiple pieces joined together by way of any suitable process, such as by welding.

Figure 2:
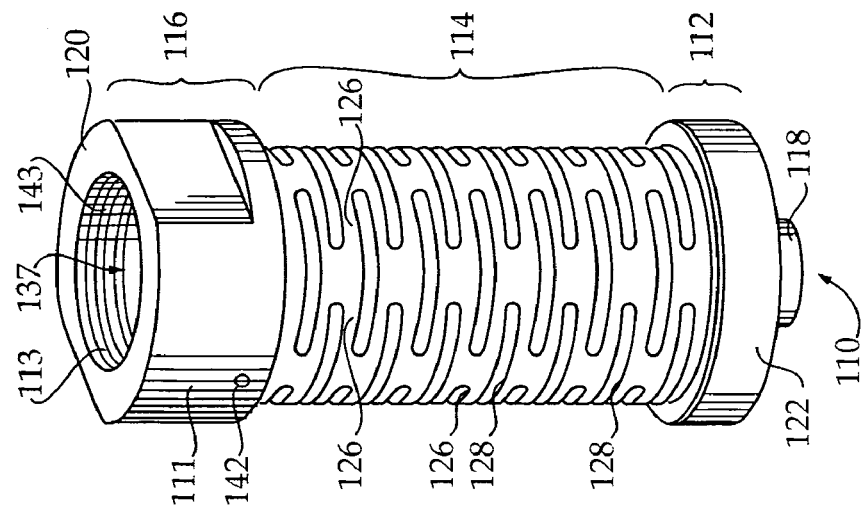
FIG. 2 is a side diagrammatic view of a multi-function spring according to another embodiment.

Turning now to FIG. 2, there is shown another spring 110 according to another embodiment. Spring 110 also includes a spring body 111, and has a first segment 112, a second segment 114 and a third segment 116. Spring 110 is similar to spring 10 of FIG. 1, but has certain differences. For instance, second segment 114 is relatively narrower in width than first segment 112 and third segment 116, whereas with spring 10 the respective segments 12, 14 and 16 may have equal widths. Further, rather than a flexural element which comprises a coil, as in spring 10, spring 110 includes a plurality of flexural elements 128 which each consist of relatively thin portions or ribs 126 of spring body 111 alternating with slots 128 along a length of spring 110. In one embodiment, slots 128 may be uniformly spaced along segment 114 in a staggered arrangement as shown, however other slot patterns or shapes are contemplated herein. It should be appreciated that the present disclosure is not limited to any specific pattern or type of flexural elements, however, a design having a uniform structure which flexes, such as the housing of Oakley et al., described above, would not fairly be understood to include "flexural elements" as contemplated herein. During extension and contraction of spring 110, ribs 126 may flex to accommodate and facilitate the change in spring length. Spring body 111 may also comprise a hollow body having a cavity 137 therein. Cavity 137 may be configured to receive a piezoelectric element as further described herein and may be closed with a piston 122 of first segment 112.

A bore 113 may also be formed in third segment 116 which connects with cavity 137. In one embodiment, a set of threads 143 comprising internal threads may be located in bore 137. Threads 143 are configured to engage with a second set of threads (not shown in FIG. 2) of an actuator utilizing spring 110 to stretch second segment 114, by way of flexing flexural elements 126, to a state which corresponds with a target preloading force on a piezoelectric element within cavity 137. Once stretched thusly, spring 110 may be maintained in a desired preloaded state. As shown in FIG. 3, spring 10 has counterpart threads 43 within bore 37 which are also configured to engage with another set of threads of an actuator utilizing spring 10 to stretch second segment 14 to a state corresponding to a target preloading force on a piezoelectric element within cavity 37, and maintain spring 10 at that state.

It will be recalled that each of springs 10 and 110 is considered a multi-function spring. As described above, each of springs 10, 110 includes a piston 22, 122 which can translate a motion of a piezoelectric element within cavity 37, 137 during operation of an associated actuator. Translating motion of a piezoelectric element is a first function performed by spring 10, 110, in particular performed by first segment 12, 112 in the illustrated embodiments. A second function is application of a preloading force on the subject piezoelectric element. Second segment 14, 114 performs this second function. A third function is actually setting and/or enabling adjustment of the preloading force via interaction of threads 43, 143 with a second set of threads to stretch second segment 14, 114, as further described herein. This strategy contrasts with earlier designs where separate components were necessary to perform these and other functions attendant to actuator assembly and operation. By integrating various features and functions into a single piece, spring 10, 110, relatively fewer parts may be used and actuator and associated device assembly made faster, easier and more reliable than in earlier strategies.

Returning to FIG. 3, there is shown an exploded view of an actuator 50 utilizing spring 10, according to the present disclosure. Actuator 50 includes a casing 51, such as a cylindrical casing. A group of components including spring 10 may be loaded into casing 51 to create an assembled actuator suitable for coupling with a device or system to be controlled thereby. In one embodiment, a diaphragm 30 which can be a disk-shaped diaphragm may be provided such that it can be positioned about contact button 24 at end 18 of spring 10. In one embodiment, diaphragm 30 may be welded to casing 51 and also welded to contact button 24 such that diaphragm 30 is fixed to move with contact button 24 during operation of actuator 50.

A piezoelectric element 32 is also shown in FIG. 3 which is positionable in cavity 37. In one embodiment, piezoelectric element 32 may be a subassembly including a thermal compensation material 35, of which there are a variety of suitable known and commercially available examples, substantially surrounding a stack of piezoelectric disks 33. In other embodiments, a monolithic piezoelectric element might be used, for instance. A first electrical terminal 34a and a second electrical terminal 34b may be provided which electrically connect with disks 33 in a conventional manner. A spacer 36 may further be provided which is positionable on top of piezoelectric element 32. A nut 38 is also illustrated which includes a second set of threads 39 configured to engage with threads 43 for setting and adjusting as well as maintaining a preload on piezoelectric element 32, as further described herein. A locking element 40 which may also comprise a nut is provided which includes external threads 41, also configured to engage with threads 43 in bore 37.

Figure 4:
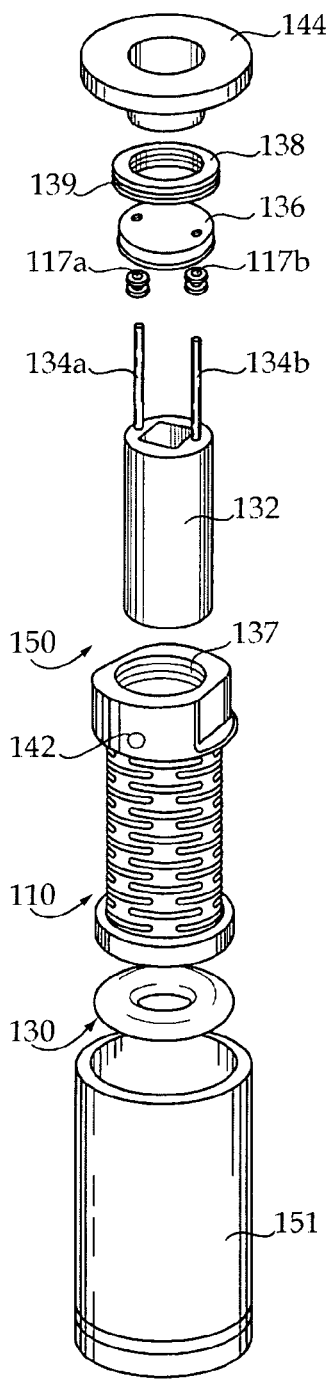
FIG. 4 is an exploded view of an actuator according to another embodiment.

Turning to FIG. 4, there is shown an exploded view of another actuator 150 according to the present disclosure, which utilizes spring 110. Actuator 150 includes a diaphragm 130, similar to diaphragm 30 and a piezoelectric element 132 which may be similar to piezoelectric element 32 of actuator 50, having electrical terminals 134a and 134b. A first sealing member 117a and a second sealing member 117b such as O-rings are positionable about terminals 117a and 117b to provide fluid seals about electrical terminals 134a and 134b. A spacer 136 and nut 138 having external threads 139 are also provided. A locking element 144 is also provided to fix nut 138 at an appropriate location within bore 137, for setting a preload on spring 110 as further described herein. A hole 142 is also provided in spring body 111 which is configured to receive a set screw, pin or the like which can inhibit relative rotation between spacer 136 and piezoelectric element 132, as well as between spacer 136 and spring body 111. Spacer 136 may include a hole (not shown) which registers with hole 142 for receipt of a set screw, pin, etc. A similar hole-set screw arrangement may be used in connection with spring 10. It will be noted that the components of actuator 150 may be loaded into a casing 151 in a direction which is opposite that of a loading direction for actuator 50.

Figure 6:
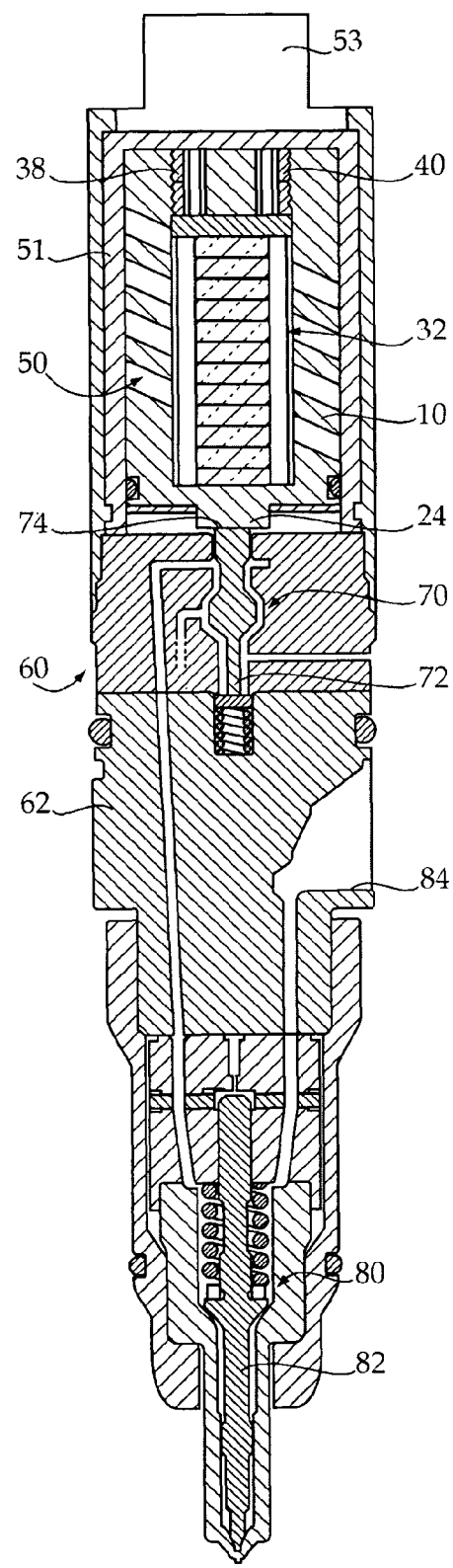
FIG. 6 is a sectioned side diagrammatic view of a fuel injector according to one embodiment.

Turning to FIG. 6, there is shown a piezoelectrically actuated device 60 according to one embodiment. Piezoelectrically actuated device 60 may be a fuel injector 60, but in other embodiments might comprise any of a variety of other piezoelectrically actuated devices such as a positioning actuator, a fluid control system for applications other than fuel systems, etc. Thus, the present description of fuel injector 60 should not be taken to limit the present disclosure in any way. Fuel injector 60 may include an injector body 62 having a control valve 70 with a control valve member 72 positioned therein. A nozzle valve 80, such as a needle check, may also be positioned in injector body 62 and includes a valve member 82. Nozzle valve 80 may be controllably coupled with control valve 70. A fluid inlet 84 is positioned in injector body 62 and supplies a high pressure fluid such as a fuel to nozzle valve 80. Actuator 50 is also disposed in injector body 62 and is configured to control valve 70 to adjust a position of valve member 82 in a conventional manner. In one embodiment, contact button 24 is positioned in contact with valve member 72. Activation of piezoelectric element 32 can adjust a position of contact button 24 which in turn acts on an end 74 of valve member 72 to adjust a position of valve member 72. As piezoelectric element 32 is activated, it will tend to extend in length against a bias of spring 10. Once piezoelectric element 32 is de-energized, spring 10 will return piezoelectric element 32 to a preloaded state. A cap 53 is also provided which is coupled with injector body 62. Cap 53, or other components, may fluidly seal actuator 50 within injector body 62.

INDUSTRIAL APPLICABILITY

Figure 5:
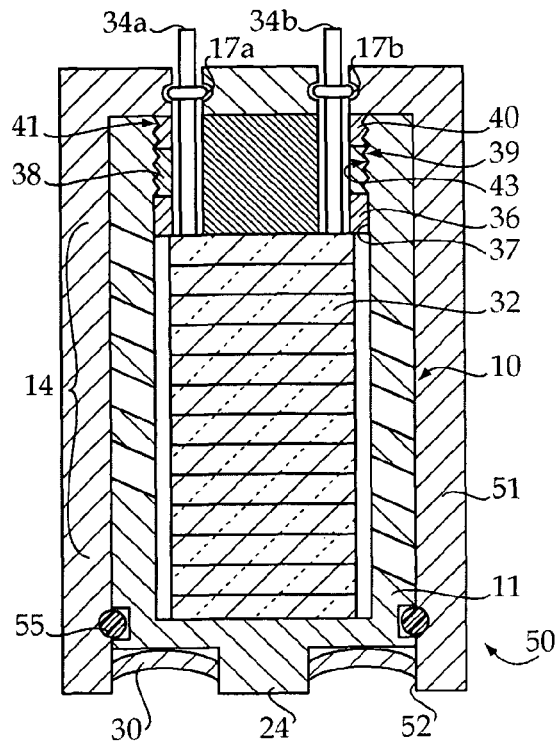
FIG. 5 is a sectioned side diagrammatic view of the actuator of FIG. 3.

Referring now to FIG. 5, there is shown a sectioned side diagrammatic view of an actuator 50 similar to actuator 50 shown above, but assembled. While only actuator 50 is specifically shown and described herein in connection with preload setting, the present description should be understood to be similarly applicable but not limiting with regard to actuator 150 and other actuators contemplated herein. Diaphragm 30 is coupled with casing 51 and with contact button 24, and surrounds contact button 24. A sealing member 55 such as an O-ring is provided which fluidly seals between spring body 11 and an inner peripheral wall 52 of casing 51. Sealing members 17a and 17b fluidly seal casing 51 at electrical terminals 34a and 34b. Spacer 36, nut 38 and locking element 40 are also assembled within casing 51 to set a preload on piezoelectric element 32 at a target preload by way of spring 10. In one embodiment, preloading piezoelectric element 32 may take place by stretching second segment 14 to a tension state which enables spring 10 to apply a force on piezoelectric element 32 which equals a desired preloading force.

Engaging threads 39 of nut 38 in bore 37 can cause nut 38 to move deeper into bore 37, increasing a length of spring 10 until it reaches a tension state at which its spring force, i.e. its tendency to return to a relaxed state, equals the target preload force for piezoelectric element 32. In certain embodiments, the target preload force may be between about 800 Newtons and about 900 Newtons. Hence, spring 10 may be expanded by rotating nut 38 in bore 37 until spring 10 exerts a preloading force via spacer 36 on piezoelectric element 32 which is equal to the target preloading force between about 800 Newtons and about 900 Newtons. In other embodiments, the preloading force might be higher than 900 Newtons or less than 800 Newtons. Once nut 38 has been used to set the preloading force on piezoelectric element 32, it may be fixed at a radial orientation relative to spring 10 which corresponds to the target preloading force by engaging locking element 38 in bore 37. Setting of the preload on piezoelectric element 132 of actuator 150 may take place in an analogous manner, threadedly engaging nut 38 into bore 137.

In one practical implementation strategy, preloading of piezoelectric element 32 may take place prior to placing spring 10 and piezoelectric element 32 within casing 51. Thus, a subassembly which includes spring 10, piezoelectric element 32, spacer 36, nut 38 and locking element 40 may be assembled, and spring 10 preloaded, then the subassembly may be inserted into casing 51. Sealing member 55 may be positioned about spring 10 prior to placing the subject subassembly into casing 51. Once inserted into casing 51, diaphragm 30 may be secured in place. The completed actuator 50 can then be coupled with fuel injector 60 by inserting actuator 50 into injector body 62 such that contact button 24 contacts valve member 72 and injector body 62 subsequently fluidly sealed via cap 53 or other components.

The multi-function springs, actuators and piezoelectrically actuated devices contemplated herein are considered to provide numerous advantages over state of the art systems. By integrating multiple functions attendant to proper actuator assembly and operation into a single component, i.e. the multi-function spring 10, 110, the overall design may be relatively simpler, use fewer parts and be easier to manufacture. These goals are achieved without compromising performance. Certain piezoelectric actuators are intended to operate for a service life that may include millions or even billions of cycles. Multi-function spring 10, 110 provides a robust and reliable means for preloading piezoelectric element 32, and houses piezoelectric element 32 within a protected environment.

Figure 7:
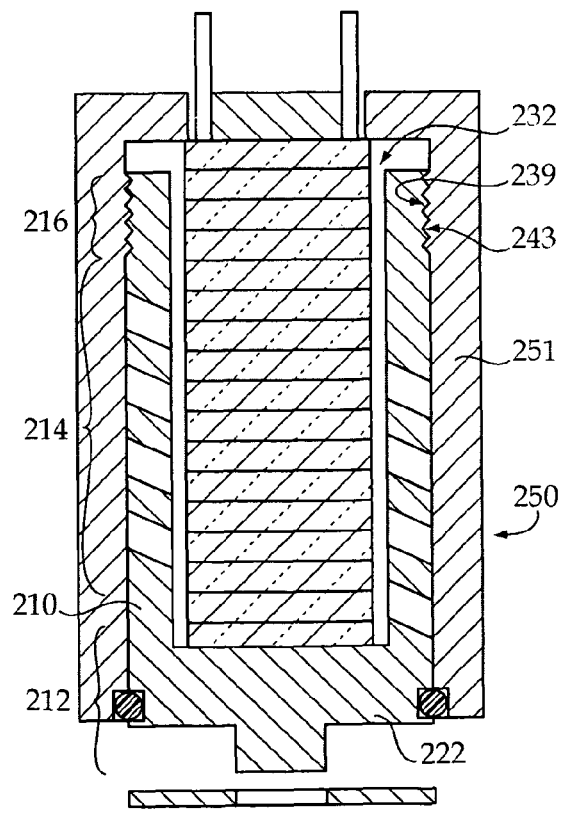
FIG. 7 is a sectioned side diagrammatic view of an actuator according to yet another embodiment.

The present description is for illustrative purposes only, and should not be construed to narrow the breadth of the present disclosure in any way. Thus, those skilled in the art will appreciate that various modifications might be made to the presently disclosed embodiments without departing from the full and fair scope and spirit of the present disclosure. For example, while the illustrated configuration for each of actuators 50 and 150 includes an internally threaded third segment 16, 116, alternatives are contemplated. External threads might be used in other embodiments, for example engaging with internal threads in an actuator casing. Referring to FIG. 7, there is shown such an embodiment wherein an actuator 250 includes a casing 251, a piezoelectric element 232 and a multi-function spring 210. In the embodiment of FIG. 7, spring 210 includes a first segment comprising a piston 222, a second segment 214 having a flexural element 226 illustrated similar to second segment 14 of actuator 50, and a third segment 216. A diaphragm 230 is also provided, similar to the other embodiments described herein. Rather than engaging threads within a bore in third segment 216, as with actuator 50, 150, external threads 243 on third segment 216 are engaged with internal threads 239 of casing 251 to draw spring 210 into a tension state for preloading piezoelectric element 232. Other aspects, features and advantages will be apparent upon an examination of the attached drawings and appended claims.

What is claimed is:

1. An actuator comprising:
   a casing;
   a piezoelectric element positionable in said casing;
   a multi-function spring also positionable in said casing and configured to apply a preloading force to said piezoelectric element;
   said multi-function spring including a one-piece spring body having a cavity formed therein in which the piezoelectric element is disposed, the one-piece spring body including a first segment having a piston configured to translate a motion of said piezoelectric element during operation of said actuator, a second segment having at least one flexural element and a third segment having a first set of threads configured to engage with a second set of threads of said actuator to stretch said second segment to a state corresponding to said preloading force; and
   a sealing member contacting the one-piece spring body and the casing, and forming a fluid seal between the one-piece spring body and the casing.

2. An actuator comprising:
   a casing;
   a piezoelectric element positionable in said casing; and
   a multi-function spring also positionable in said casing and configured to apply a preloading force to said piezoelectric element;
   said multi-function spring including a first segment having a piston configured to translate a motion of said piezoelectric element during operation of said actuator, a second segment having at least one flexural element and a third segment having a first set of threads configured to engage with a second set of threads of said actuator to stretch said second segment to a state corresponding to said preloading force;
   wherein said multi-function spring comprises a cavity in which said piezoelectric element is disposed and a bore in said third segment which connects with said cavity, and wherein said first set of threads comprises internal threads located within said bore.

3. The actuator of claim 2 further comprising a nut having said second set of threads located thereon, and said nut being positioned at least partially within said bore.

4. The actuator of claim 3 further comprising a locking element fixing said nut and said multi-function spring at a relative radial orientation where said second segment is stretched to the state corresponding to said preloading force.

5. The actuator of claim 2 wherein said second segment includes at least one slot, and wherein said at least one flexural element adjoins said at least one slot.

6. The actuator of claim 5 wherein said at least one slot comprises a helical slot, and wherein said at least one flexural element comprises a helical coil.

7. The actuator of claim 5 wherein said second segment comprises a plurality of uniformly distributed slots, and wherein said at least one flexural element comprises a plurality of uniformly distributed ribs.

8. The actuator of claim 1 wherein said casing comprises an inner peripheral wall, and wherein said sealing member includes an O-ring fluidly sealing between said inner peripheral wall and said first segment.

9. The actuator of claim 8 wherein said first segment includes a contact button configured to contact a valve element of a fuel injector for controlling an injection of fuel thereby, and wherein said actuator further comprises a diaphragm surrounding said contact button and fixed to move therewith during operation of said actuator.

10. A piezoelectrically actuated device comprising:
    a body;
    a valve disposed within said body;
    an actuator for said valve, said actuator including a casing coupled with said body and a piezoelectric element disposed within said casing;
    said actuator further including a multi-function spring applying a preloading force to said piezoelectric element, said multi-function spring having a one-piece spring body including a first segment having a piston configured to translate a motion of said piezoelectric element during operation of said actuator, a second segment having at least one flexural element and a third segment having a first set of threads engaged with a second set of threads of said actuator and maintaining said second segment in a tension state which corresponds with said preloading force; and
    a sealing member contacting the one-piece spring body and the casing, and forming a fluid seal between the one-piece spring body and the casing.

11. The device of claim 10 comprising a fuel injector, wherein said valve comprises a control valve and said fuel injector includes a nozzle valve controllably coupled with said control valve.

12. The device of claim 11 wherein said first segment and said third segment comprise end segments of said multi-function spring, and wherein said second segment comprises a middle segment of said multi-function spring adjoining each of said first and third segments.

13. The device of claim 12 wherein said second segment has a cylindrical shape, and wherein said at least one flexural element comprises a plurality of flexural elements uniformly distributed in said second segment.

14. The device of claim 12 further comprising a nut having said second set of threads located thereon, said multi-function spring further comprising a bore having said first set of threads located therein.

15. The device of claim 11 wherein said actuator is fluidly sealed within said body, and wherein said actuator further comprises a plurality of sealing members fluidly sealing said piezoelectric element and said multi-function spring within said casing.

* * * * *